United States Patent [19]

Ekin et al.

[11] 4,437,080
[45] Mar. 13, 1984

[54] METHOD AND APPARATUS UTILIZING CRYSTALLINE COMPOUND SUPERCONDUCTING ELEMENTS HAVING EXTENDED STRAIN OPERATING RANGE CAPABILITIES WITHOUT CRITICAL CURRENT DEGRADATION

[75] Inventors: John W. Ekin, Boulder, Colo.; John R. Gavaler; Aleksander I. Braginski, both of Pittsburgh, Pa.

[73] Assignees: The United of America as represented by the Secretary of Commerce and the Secretary of the Air Force; The United States of America as represented by the Secretary of the Air Force, both of Washington, D.C.

[21] Appl. No.: 465,942

[22] Filed: Feb. 14, 1983

[51] Int. Cl.³ .............................................. H01F 7/22
[52] U.S. Cl. ................................. 335/216; 174/126 S
[58] Field of Search .................... 335/216; 174/126 S, 174/128 S

[56] References Cited

U.S. PATENT DOCUMENTS 4,195,199  3/1980  Hillmann .................... 335/216 X
4,242,536 12/1980  Young ......................... 335/216 X Primary Examiner—George Harris
Attorney, Agent, or Firm—Eugene J. Pawlikowski; Alvin J. Englert

[57] ABSTRACT

Method and apparatus are disclosed utilizing superconducting elements with extended strain operating range capabilities. The superconducting element is formed from a crystalline compound superconductive material that does not exhibit appreciable critical current degradation in the presence of high elastic strains imposed on the element. Such a crystalline compound superconductive material is selected from materials in the B1 and C15 crystal structure classes. The thus formed superconducting element is particularly useful in electromagnets requiring high magnetic fields for operation in the intended manner.

20 Claims, 9 Drawing Figures

METHOD AND APPARATUS UTILIZING CRYSTALLINE COMPOUND SUPERCONDUCTING ELEMENTS HAVING EXTENDED STRAIN OPERATING RANGE CAPABILITIES WITHOUT CRITICAL CURRENT DEGRADATION

FIELD OF THE INVENTION

This invention relates to a method and apparatus utilizing superconducting elements, and, more particularly, relates to a method and apparatus utilizing crystalline compound superconducting elements with extended strain operating range capabilities with no appreciable degradation of critical current.

BACKGROUND OF THE INVENTION

The use of wire to form magnetic coils is well known. Also, it is known that superconductive materials formed from certain alloys can be used to form devices such as magnetic coils, with such devices being limited, however, to use where the magnetic fields are relatively small (normally less than 8 Tesla).

It is likewise known that superconductive materials belonging to the A15 crystal structure class can be, and are, presently used in magnetic coils utilizing high current superconducting elements where magnetic fields greater than about 8 Tesla (T) are needed, or where an increased temperature margin for stability is needed.

While coils utilizing A15 superconductors have been successfully utilized, at least in some instances, it has been found that mechanical strain (compressive or tensile) severely degrades (decreases) the critical current and critical field of the superconductive materials. For example, in the most commonly used high magnetic field superconductive material ($Nb_3Sn$), an intrinsic tensile strain of only 0.5% has been found to produce approximately a 50% reversible decrease in the critical current at a magnetic field of 12T relative to the superconductive material's strain free critical current. It has been found that similar degradation of the critical current and critical field occurs with mechanical strain in other practical A15 superconductive materials, including $Nb_3Sn$, Nb-Hf/Cu-Sn-Ga, Nb-Ta/Cu/Sn, Nb-Ti/Cu-Sn, $Nb_3Ge$, $Nb_3Al$, and $V_3Ga$. The degradation is a consistent, reproducable and reversible function of the strain experienced by superconductive materials, and the relative magnitude of the degradation becomes greater the higher the magnetic field applied to the superconductor.

A superconductive wire that is stated to have improved strain characteristics formed from A15 crystal structure materials is shown in U.S. Pat. No. 4,324,842. While this wire is said to provide a better strain characteristic than was heretofore provided by known $Nb_3Sn$ conductors, in order to prevent appreciable degradation of the critical current, the operating range must still be limited to a narrow strain range where the critical current is maximum. Also, as the magnetic field experienced by the superconductor is increased, the relative strain degradation of the critical current in the superconductive wire becomes much larger than that shown, which was measured at 4 T.

Forming a fiber, or wire, utilizing a superconductive material from the B1 crystal structure class has also been heretofore suggested (see, for example, U.S. Pat. Nos. 3,951,870 and 4,050,147 and United Kingdom Patent application Number 2044737). Likewise, it has also been heretofore suggested that a superconductive wire made from materials in the B1 crystal structure class might be used to form a magnetic coil (see, for example, U.S. Pat. No. 3,951,870). Use of superconductive elements formed from the B1 crystal structure class have not, however, been heretofore suggested as a device for extending strain operating ranges in applications such as high field magnet systems, rotating machinery and/or transmission lines, for example.

SUMMARY OF THE INVENTION

This invention provides a method and apparatus utilizing superconductive elements to extend strain operating range capabilities with no appreciable degradation of critical current. This has been found to be particularly useful where the superconductive element is subjected to strain in the presence of high magnetic fields.

It is therefore an object of this invention to provide an improved method and apparatus utilizing superconducting elements.

It is another object of this invention to provide an improved method and apparatus utilizing superconducting elements to extend strain operating range capabilities with no appreciable degradation of critical current.

It is still another object of this invention to provide a method and apparatus utilizing superconducting elements to extend the strain operating range with no appreciable degradation of critical current even where high magnetic fields are encountered.

It is yet another object of this invention to provide a method and apparatus utilizing superconducting elements formed from crystalline compound superconductive materials to extend the strain operating range with no appreciable degradation of critical current.

It is still another object of this invention to provide a method and apparatus utilizing superconducting elements formed from crystalline compound superconductive materials in the B1 and C15 crystal structure classes to extend the strain operating range with no appreciable degradation of critical current.

With these and other objects in view, which will become apparent to one skilled in the art as the description proceeds, this invention resides in the novel construction, combination, arrangement of parts and method substantially as hereinafter described and more particularly defined by the appended claims, it being understood that such changes in the precise embodiment of the herein disclosed invention were meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1A:
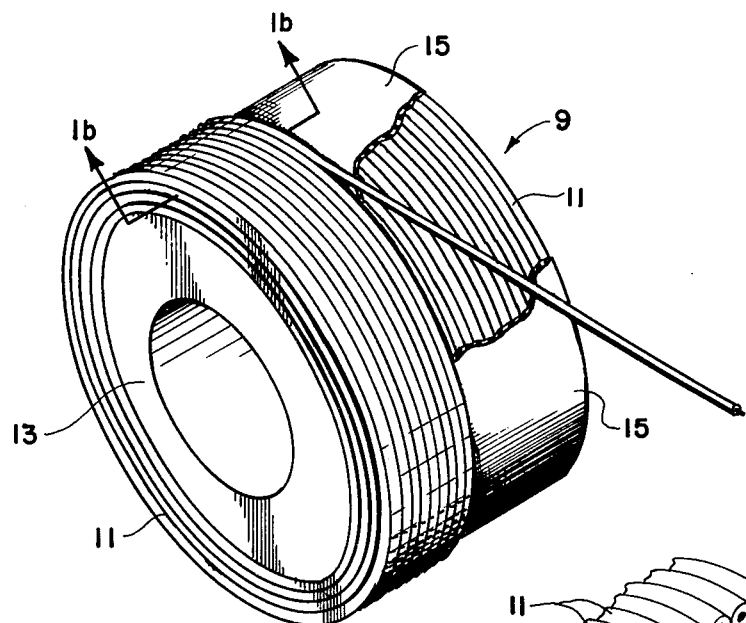
FIG. 1a is a perspective view of a magnetic coil illustrating strains that can be imposed thereon.

This invention utilizes high-current crystalline compound (non-alloy) superconducting elements which are designed to operate with optimum critical current and critical field outside the normal intrinsic strain design limits.

The strain experienced by the superconductive material in a device, or element, is referred to herein as the intrinsic strain and is determined by the device's design, including its geometric configuration, the various materials from which the device is made, and the operating current. The normal aim in the mechanical design of superconductive devices is to limit the net intrinsic strain (compressive or tensile) that the superconductive material experiences under full-current operating conditions to a small magnitude, typically less than 0.3%, in order to prevent excessive degradation of its critical current. In many instances, this places severe restraints on the design of the device and its application.

It has been discovered that, unlike A15 superconductive materials, superconductors belonging to the B1 crystal structure class (such as NbN and NbCN) or the C15 crystal structure class [such as $V_2(Hf,Zr)$] show no measurable decrease (less than 1%) in their critical field or high field (greater than 8T) critical current characteristics from elastic strain, even in the presence of magnetic fields as high as 22 T. A more detailed showing of these data for B1 superconductors is included in Appl. Phys. Lett. 41 (10), Nov. 15, 1982, entitled "Effect of Strain on the Critical Current and Critical Field of B1 Structure NbN Superconductors," by J. W. Ekin, J. R. Gavaler, and J. Greggi. In addition, a more detailed showing of the high field data for C15 superconductors is included in Appl. Phys. Lett. 40 (9), May 1, 1982, entitled "Effect of Strain on the Critical Parameters of $V_2$ (Hf,Zr) Laves Phase Composite Superconductors" by H. Wada, K. Inoue, K. Tachikawa and J. W. Ekin.

Among the B1 superconductors, NbN, recyrstallized NbN and NbCN have been tested. Due to the strong correlation of the critical current, elastic strain effect with superconductors in the A15 crystal structure class, it is felt that the lack of any such effect in NbN and NbCN is a general property of all superconductors having the B1 crystal structure, including, but not limited to NbN, NbCN, MoC, and NbC. It is also felt that this is a general property of these superconductive materials which is independent of manufacturing technique.

The insensitivity of the critical current and critical field of the B1 superconductive materials to elastic strain is limited only by the superconductive material's fracture strain, which can be as high as 1.2% or more in tension, and is typically much greater than 1% in compression.

This property of B1 superconductive materials makes it possible to design superconductor devices that will operate without electrical degradation at strain magnitudes (compressive or tensile) significantly greater than those presently used. Such an extended strain range operating mode is of particular advantage both in the design and operation of superconducting devices where alloy superconductors such as NbTi and NbZr (which exhibit only small critical current degradation with elastic strain) cannot be utilized (because of their lower critical fields and critical temperatures).

Devices that benefit from this include, for example, high-field superconducting magnet systems, where the presence of large magneto-mechanical forces necessitates the use of large amounts of distributed structural material. Differential thermal contraction between the structural material and the superconductive material can subject the superconductive material to high intrinsic strain which results in a large decrease in critical current. For example, the use of large amounts of stainless steel distributed reinforcement can place the superconductive material under as much as 0.9% compression through differential thermal contraction.

Also included are superconducting rotating machinery where rotational forces can subject the superconductive material to high intrinsic tensile strain. In superconductive transmission lines (both high-current and those utilized in micro-electronic superconducting devices) the superconductive material can be subjected to high strain from differential thermal contraction with structural materials. Each of these devices can benefit from the utilization of B1 (and C15) superconductors to permit operating the superconducting material in a high intrinsic strain state without degradation in its electrical critical parameters.

Being now specific with respect to the foregoing, the superconductive behavior of a superconductor is lost when the current, magnetic field, or temperature it experiences exceeds limits referred to as the critical current, upper critical field, and critical temperature. During the measurement of critical current, a superconducting wire is maintained within a temperature range in which the wire exhibits superconductive behavior, while the wire is subject to a magnetic field. The critical current is an important parameter indicating the maximum current carrying capacity of a superconductor.

The critical current of alloy superconductors such as NbTi or NbZr, is not affected strongly by strain and thus these materials are the preferred materials for superconductor magnets where the superconductor is not subjected to magnetic fields greater than approximately 8 T or temperatures much higher than approximately 4° K. However, in superconductor magnets where the superconductive material experiences higher magnetic fields or temperatures than as set forth hereinabove, crystalline compound superconductors are utilized because a number of these materials have upper critical fields and critical temperatures which are significantly higher than those of the alloy superconductors. Crystalline superconductors presently utilized in such magnets belong to the A15 crystal structure class, the most popular material being $Nb_3Sn$. Unfortunately the critical current of superconductors belonging to the A15 crystal structure class is strongly reduced by either tensile or compressive strain applied to the superconductive material.

The intrinsic strain experienced by a superconductive material in a superconductor device, such as a high-field magnet, arises from several well defined sources—it is the sum of the winding tension strain and bending strain introduced during coil winding, the differential thermal contraction strain introduced by other materials in mechanical contact with the superconductive material, and the electromechanical strain introduced when the superconductor is energized. The intrinsic strain can thus be determined *a priori* from the design of the device, that is, from its geometric configuration, the material used in its construction, and the maximum operating current.

Figure 1B:
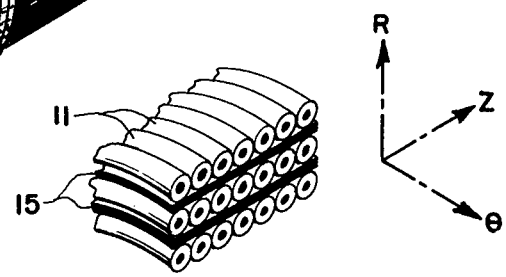
FIG. 1b is a partial perspective view of the coil of FIG. 1a illustrating the superconducting wire in greater detail and illustrating the forces and strain thereat.

FIG. 1a illustrates a magnetic coil 9 formed by a plurality of wires 11 wrapped in layers about a bobbin 13. As shown in FIG. 1b, each layer of wire is separated from the adjacent layer by an insulating layer 15 (each wire is, of course, also surrounded by insulation so that each wire is insulated from the adjacent wire in each layer. FIG. 1b, also illustrates the bending and pretensioning uniaxial strain ($\theta$ component) incurred during coil winding.

Figure 2:
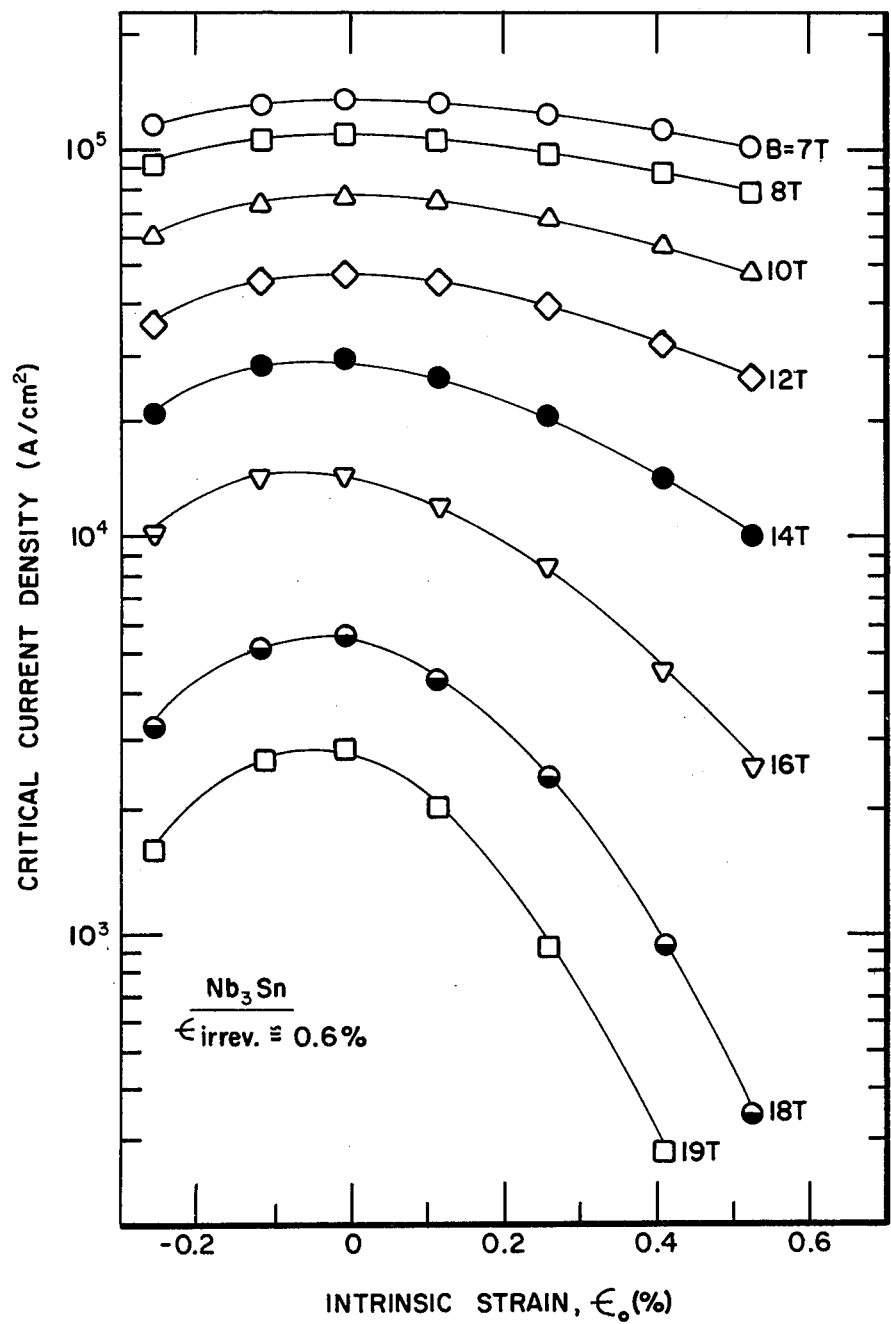
FIG. 2 is a graphical presentation illustrating the intrinsic strain dependence of the critical current density for a typical A15 superconductor ($Nb_3Sn$) at various magnetic field strengths (B)

The effect of uniaxial (one dimensional) intrinsic strain on the critical current density, $J_c$ (critical current divided by the conductor cross sectional area), for a typical commercial multifilamentary A15 superconductor, $Nb_3Sn$, is shown in the graph of FIG. 2. In this figure, the ordinate represents the critical current density, while the abscissa represents the percent of intrinsic strain, $\epsilon_o$, experienced by the superconductive material. Negative values of the intrinsic strain parameter in FIG. 2 indicate the superconductive material is under compression, while positive values indicate tension.

Since practical superconductor wires, tapes and cables (referred to herein as simply conductors) are usually fabricated as a composite of both superconductive material and non-superconductive material in mechanical contact, the intrinsic strain in FIG. 2 refers only to the strain experienced by the superconductive material and not the overall strain experienced by the conductors. The difference arises because differential thermal contraction between the materials in the conductor can generate internal forces on the superconductive material which make the intrinsic strain different from overall wire strain. Usually in unstrained A15 superconductor wires, the superconductive material is initially under compressive intrinsic strain, as shown in FIG. 2, because of thermal contraction introduced from the non-superconductive materials in the conductor when the wire is cooled from fabrication temperature to operating temperature.

It should be noted from FIG. 2 that critical current density depends strongly on the intrinsic strain (either compressive or tensile) experienced by the superconductive material, with the maximum value occurring when the intrinsic strain is approximately zero. This is true for all applied magnetic fields. It should also be noted from FIG. 2 that the relative decrease of $J_c$ with intrinsic strain becomes greater at higher magnetic fields.

The strain degradation of the critical current shown in FIG. 2 is reversible and is referred to herein as elastic strain degradation. That is, when the strain is removed, the critical current returns to its optimum zero strain value. Eventually, if enough strain is applied, the superconductive material will be permanently damaged and the strain degradation is no longer reversible. This occurs at the onset of plasticity deformation of the superconductor and the strain, where this commences, is referred to herein as the irreversible strain point, $\epsilon_{irrev}$. For multifilamentary $Nb_3Sn$ superconductors, intrinsic tensile values of $\epsilon_{irrev}$ are usually in the range from about $+0.5\%$ to 1% or more. Compressive values of $\epsilon_{irrev}$ have not been measured but are at least as great as $|-1\%|$ in magnitude.

Thus, for A15 superconductors such as $Nb_3Sn$, $\epsilon_{irrev}$ is usually well beyond the range where elastic strain degradation has a large effect. In this discussion it is implicitly understood that the elastic strain limits (discussed below) are bounded by the irreversible strain limits, $\epsilon_{irrev}$, because permanent critical-current degradation occurs very rapidly with strain beyond this point. The value of $\epsilon_{irrev}$ depends on the particular conductor configuration, whereas the elastic strain effect is consistently the same within a few percent for different conductor configurations of the same superconductive material.

Figure 3:
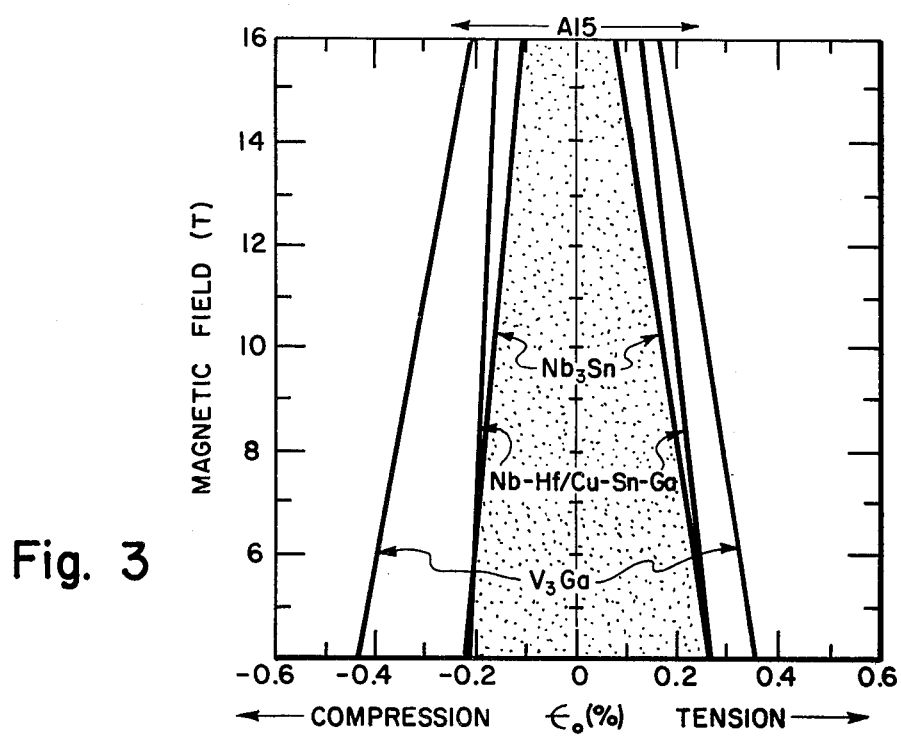
FIG. 3 is a graphical presentation illustrating a compressive-tensile strain window for limiting critical current degradation to 5% or less for various A15 superconductors.

The elastic strain limits imposed by $Nb_3Sn$ on the mechanical design of a device utilizing this material may be read directly from FIG. 2 for any magnetic field. The compressive and tensile strain limits needed to prevent more than a 5% degradation in the $J_c$ of $Nb_3SN$ are shown by the shaded region as shown in FIG. 3. It would, however, be preferable to prevent more than a 2% degradation in the $J_c$ to obtain optimum performance. In the graph of FIG. 3, the ordinate represents the perpendicular magnetic field applied to the superconductive material, while the abscissa represents the percent intrinsic strain $\epsilon_o$ experienced by the superconductive material. There is both a tensile (positive value of $\epsilon_o$) and a compressive (negative value of $\epsilon_o$) strain limit, depending on the magnetic field, that must not be exceeded if the $J_c$ of $Nb_3Sn$ is to be greater than 95% of its optimum (strain free) $J_c$ at $\epsilon_o=0$. That is, to prevent more than a 5% strain degradation in the $J_c$ of $Nb_3Sn$, the intrinsic strain it experiences at full design operating conditions must be within this strain window (the shaded region of FIG. 2). Note that the strain window becomes progressively narrower as the design field is increased, decreasing from approximately $\pm 0.2\%$ at 8 T to approximately $\pm 0.1\%$ at 14 T.

Thus, in superconductor magnets utilizing $Nb_3Sn$, it is essential that the superconductive material not be subjected to too large a compressive or tensile strain, or there will be a significant decrease in the current carrying capacity of the superconductor. This places rather restrictive mechanical design limits on magnets utilizing $Nb_3Sn$.

The strain design limits are not much improved in other A15 superconductors that are being considered for commercial high-field magnets. $J_c$ vs. $\epsilon_o$ behavior similar to that shown in FIG. 2 is exhibited by all A15 superconductors examined to date, including $Nb_3Sn$, $V_3Ga$, $Nb_3Al$, Nb-Hf/Cu-Sn-Ga, Nb-Ta/Sn, and $Nb_3Ge$.

Compressive and tensile strain limits to prevent more than a 5% $J_c$ degradation in Nb-Hf/Cu-Sn-Ga superconductors have been evaluated from data in the above cited references and are also plotted in the graph of FIG. 3. Not plotted are the strain design limits for Nb-Ta/Sn, which are within 0.05% of those shown for Nb-Hf/Cu-Sn-Ga, and similar behavior is expected for other ternary forms of $Nb_3Sn$. The strain design limits for $Nb_3Ge$ are close to $Nb_3Sn$, and the strain limits for $Nb_3Al$ are close to those shown for $V_3Ga$.

Thus, high-field superconducting magnets utilizing A15 superconductors as they are currently constructed, must operate within a narrow strain range in order to prevent significant, or appreciable, degradation (in the range of 5% or less) of the critical current of their superconductive material. As can be appreciated, the window as shown in FIG. 3 would be significantly narrower to prevent more than a 2% degradation of critical current of A15 superconductors; for example, for $V_3Ga$ the magnitude of the strain limits in this case would be less than about 0.3% for both tensile and compressive intrinsic strains above about 10 T.

It is anticipated that these uniaxial, one dimensional strain limits can be extended to a multidimensional form using a theory similar to that which Von Mises developed for determining yield strength in three dimensions. In particular, a geometric average strain $<\epsilon>$ is currently being used in place of the intrinsic strain parameter $\epsilon_o$ in FIG. 3 to set three-dimensional strain limits in magnet design, where $$<\epsilon> = \frac{\sqrt{2}}{2(1+V)}[(\epsilon_r - \epsilon_\theta)^2 + (\epsilon_\theta - \epsilon_z)^2 + (\epsilon_z - \epsilon_r)^2]^{\frac{1}{2}}$$

Here $\epsilon_r, \epsilon_o,$ and $\epsilon_z$ are the components of strain along the coordinate axes defined in FIG. 1b, and V is the Poisson's ratio of the superconductive material.

To stay within these strain limits, the high field superconductor magnets are constructed at present so that the sum of all forces under full design operating conditions places the superconductive material in a near zero strain state, typically within about ±0.3% of zero intrinsic strain. This is accomplished by minimizing differential thermal contraction strains between the superconductive and other nonsuperconducting materials with which it is in contact, by limiting the uniaxial tensile strain introduced from winding tension during fabrication, by limiting the magneto-mechanical strain introduced when the magnet is energized, and by limiting the bending strain introduced into the superconductive material from conductor curvature. These mechanical strain limits severely restrict the choice of geometry, materials, and operating currents used in present high field (greater than 8 T) magnet systems.

Figure 4:
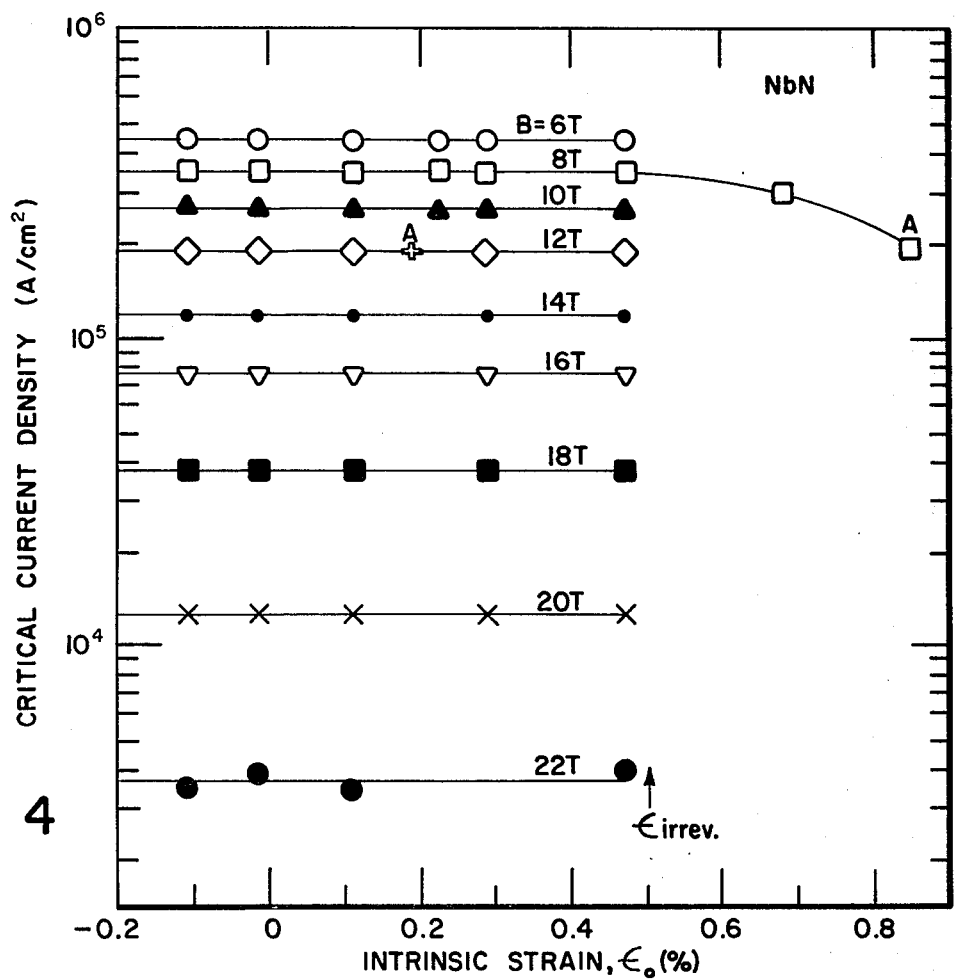
FIG. 4 is a graphical presentation illustrating the effect of intrinsic strain on the critical current density of a 0.2-μm-thick B1 superconductor (NbN) film at magnetic fields from 6 T to 22 T.
Figure 5:
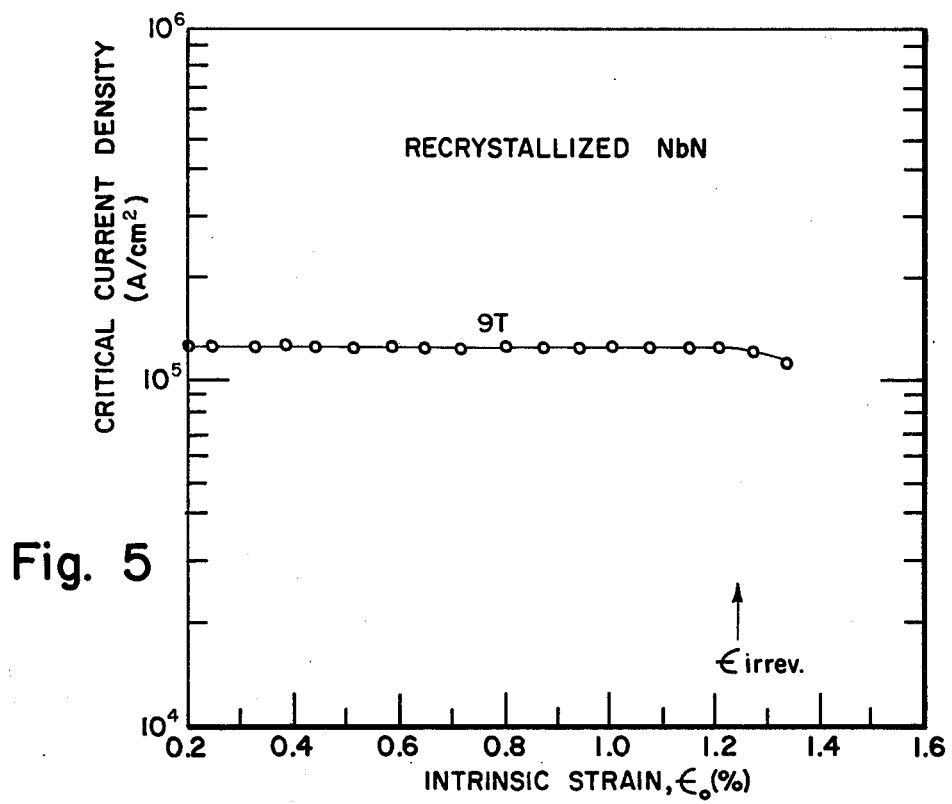
FIG. 5 is a graphical presentation illustrating the effect of intrinsic strain on the critical density of a second B1 superconductor (recrystallized NbN) film at a magnetic field of 9T.
Figure 6:
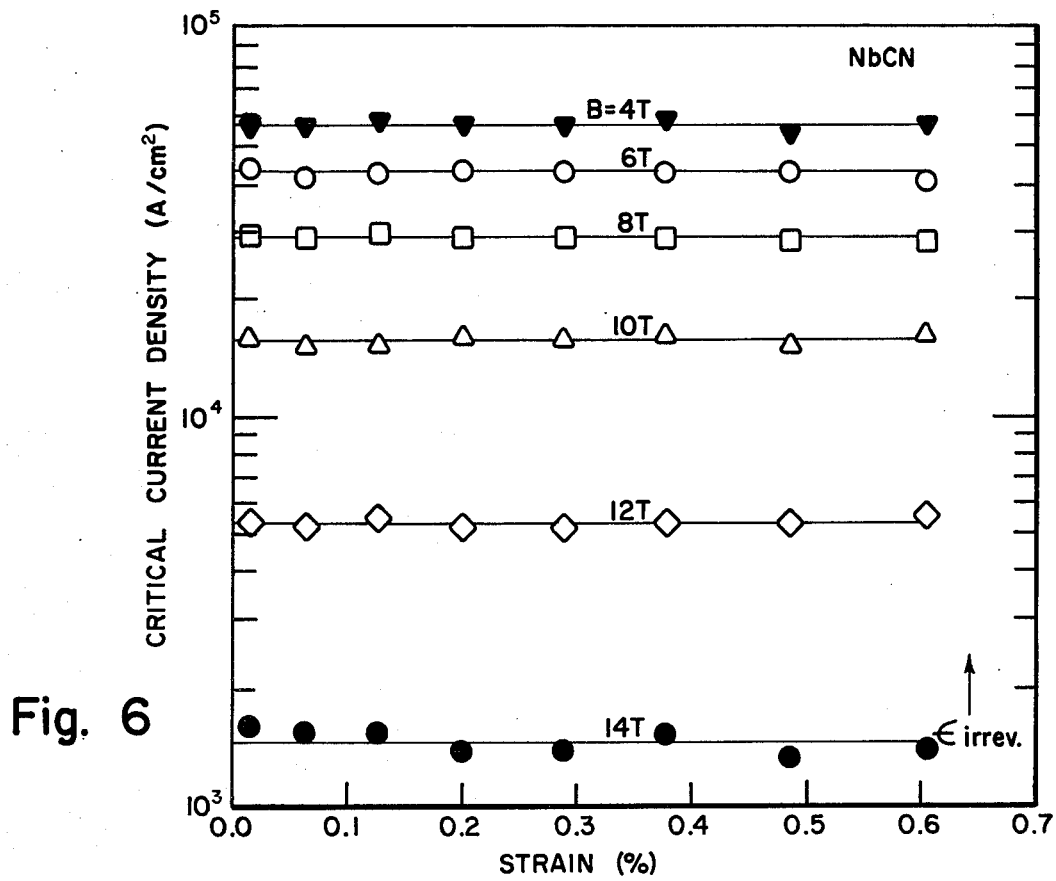
FIG. 6 is a graphical presentation illustrating the effect of overall conductor strain on the critical current density of a third B1 superconductor (NbCN) film at various magnetic field strengths.

A new property of certain superconductors belonging to the B1 crystal structure class has been found as brought out hereinabove. FIGS. 4, 5 and 6 show the effect of intrinsic or overall conductor strain on the critical current density of NbN, recrystallized NbN, and NbCN, respectively. Unlike A15 superconductors, the critical current does not degrade with elastic strain. As shown in FIGS. 4, 5 and 6, the decrease in $J_c$ is less than 0.5% (the measurement accuracy in these tests) over the entire strain range up to the irreversible tensile strain limit, $\epsilon_{irrev}$. Thus the only mechanical strain limits imposed on superconducting magnets fabricated using B1 superconductors such as NbN, recrystalline NbN, and NbCN is the irreversible strain limit $\epsilon_{irrev}$. Furthermore, $\epsilon_{irrev}$ is not an intrinsic limit of these superconductive materials. Instead it is a function of strain of the nonsuperconducting materials to which the superconductive material is bonded and through proper choice of these nonsuperconducting materials the tensile $\epsilon_{irrev}$ has been made greater than 1.2% as shown in FIG. 5. This is discussed in greater detail in IEEE Trans. Mag. MAG-19, 1983 entitled "Properties of NbN Films Crystallized From the Amorphous State," by J. R. Gavaler, J. Greggi, R. Wilmer, and J. W. Ekin. The irreversible compressive strain limit is large enough in magnitude that it has not been measured for these materials, but it is expected to be at least as great in magnitude as the irreversible tensile strain limit.

NbN and NbCN, as shown in FIGS. 4 and 6, have been tested over an extended magnetic field range. However, because of the strong correlation of the critical current, elastic strain effect with superconductors in the A15 crystal structure group, it is anticipated that the lack of any such effect in NbN and NbCN will be a general property of all superconductors having the B1 crystal structure, including but not limited to NbN, NbCN, MoC, and NbC. It is also anticipated that this will be a general property of these superconductive materials which is independent of manufacturing technique. For example, insensitivity of the critical current to elastic strain has been observed in NbN conductors fabricated by direct sputter deposition shown in FIG. 4, as well as by recrystallization from an amorphous state as shown in FIG. 5.

Figure 7:
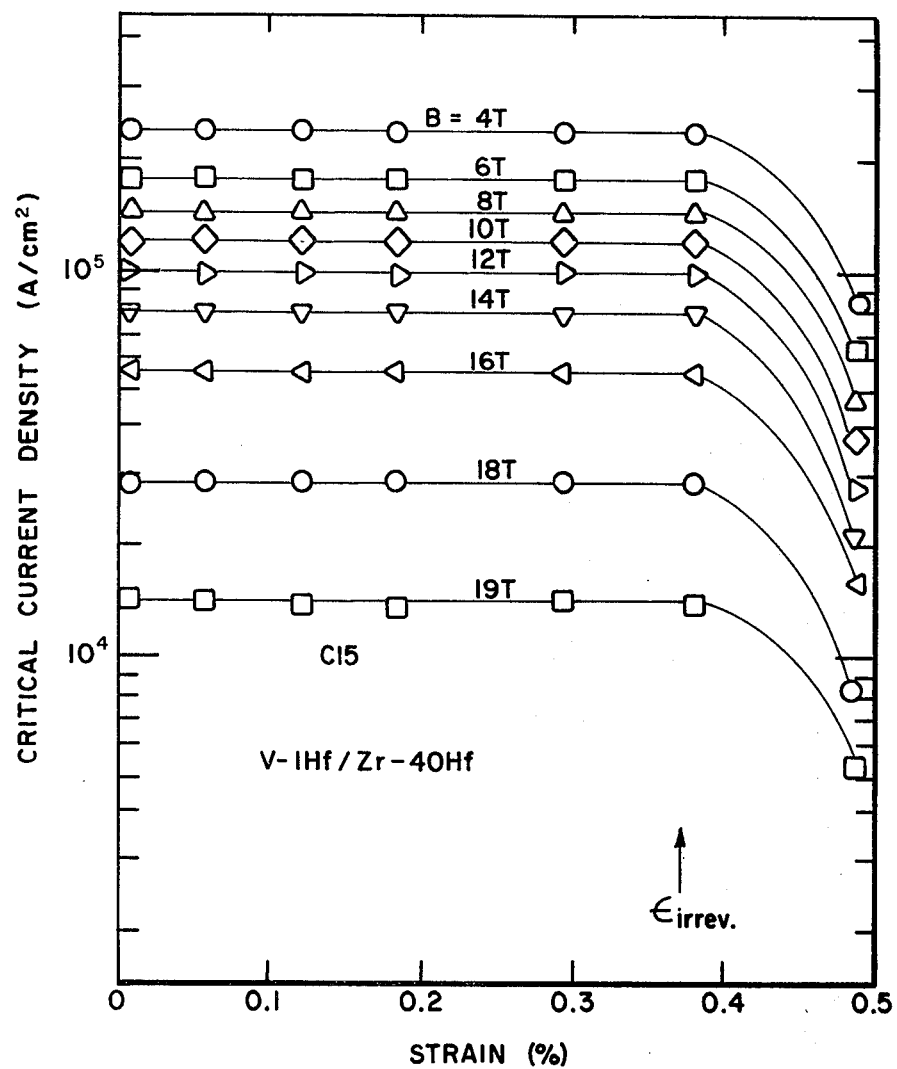
FIG. 7 is a graphical presentation illustrating the effect of overall conductor strain on the critical current density of a C15 superconductor (V-1HF/Zr-40Hf) film at various magnetic field strengths.

FIG. 7 shows the effect of uniaxial strain on the critical current density of a typical C15 superconductor (V-1Hf/Zr-40Hf). As shown, the critical current does not degrade with elastic strain. The decrease in $J_c$ is less than 0.5% over the entire strain range up to the irreversible tensile strain limit, $\epsilon_{irrev}$. It is likewise anticipated that all C15 superconductors will exhibit the same characteristics.

The strain insensitivity of the critical current of B1 superconductors such as NbN and NbCN or C1 superconductors such as $V_2$ (Hf,Zr) makes it possible to design and operate high field superconductive devices without critical current degradation at compressive or tensile strains well beyond the strain regime presently used. This is particularly advantageous where large bending strain cannot be avoided such as in high field (>8 T) superconductive magnets wherein a high current superconductor with a large cross sectional area is required to be bent with a sharp radius of curvature. Bending strain limits can be calculated from uniaxial strain data such as that shown for $Nb_3Sn$ in FIG. 2 (the details for such a calculation are shown in "Strain-Scaling Law and the Prediction of Uniaxial and Bending Strain Effects in Multifilamentary Superconductors", in *Filamentary A15 Superconductors* pp. 187–203 edited by M. Suenaga and A. F. Clark, Plenum Press, New York, 1980. Normally magnets constructed of A15 superconductors are designed such that the bending strain magnitude averaged over the conductor crossection does not exceed |0.2%| tension or compression in order to prevent significant critical current degradation.

Another typical high field magnet apparatus that benefits from operating the superconductive material at high strain levels is in the use of superconducting windings in large motors and generators. In an application to motors and generators, the superconductive material is not only subjected to bending strain, winding strain, thermal contraction strain, and electromechanical strain as discussed above, but can also experience significant strain from rotational forces. At high rotational speeds, the total intrinsic strain can readily exceed the degradation strain limits of A15 superconductors. Hence, B1 and C15 superconductors are preferable for use to enable the generator (or motor) to operate in the intended manner.

Figure 8:
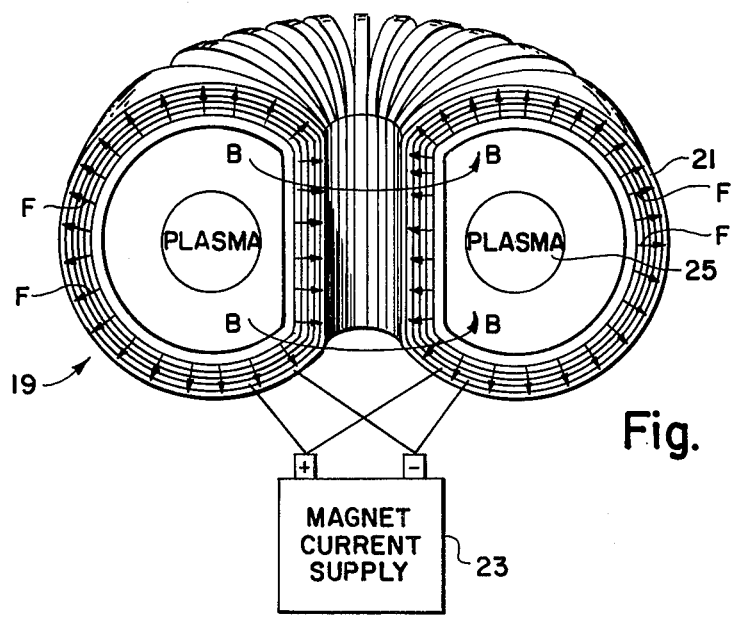
FIG. 8 is a partially cut-away simplified perspective view illustrating a typical device (superconducting toroidal magnets used for plasma confinement in a tokamak fusion reactor) utilizing superconductive elements having extended strain operating range capabilities in a high magnetic field environment.

Another typical high field magnet apparatus that benefits from operating the superconductive material at high strain levels is in a tokamak fusion reactor where superconducting toroidal magnets are used for plasma confinement, as shown in FIG. 8. As shown, superconducting toroidal magnets 19 include superconductor windings 21 which are maintained at low temperatures (which is common to superconductive windings known in the art). When windings 21 are energized by a magnet current supply 23, electromagnetic forces (F) are established, as are magnetic fields (B), to maintain plasma 25 confined.

In this and other large magnet applications, such as superconductor medical imaging systems, the electromagnetic forces can be particularly high, requiring a great amount of structural material to be incorporated into the superconductive windings. For example, it has been calculated that a fully stabilized $Nb_3Sn$ conductor in a 12 T fusion magnet would consist of nearly 50% stainless steel, while the $Nb_3Sn$ itself would occupy only about 10% of the volume. To be effective in providing adequate support for the superconductor, it is essential to have this large amount of reinforcing material distributed throughout the winding. A superconductor fabricated with stainless steel as an integral part of the wire would provide distributed support of the superconductor as well as simplify the magnet construction, particularly if the reinforcement were prefabricated with compound superconductors in their unreacted (ductile) state.

In such a composite, however, the reinforcing material places the superconductor under large compressive strain, well beyond the normal operating strain range. It has been shown, for example, that a $Nb_3Sn$ conductor containing 33% stainless steel results in the superconductive material being placed under 0.64% compression, degrading the critical current by more than 50% at 13 T. Details of this measurement are included in Jour. Appl. Phys. Volume 54 1983, entitled "Effect of Stainless Steel Reinforcement on the Critical Current versus Strain Characteristics of Multifilamentary $Nb_3Sn$ Superconductors" by J. W. Ekin, R. Flukiger, and W. Specking. The use of a B1 or C15 superconductor, in place of $Nb_3Sn$ allows high-field magnets with integral stainless steel reinforcement to be operated without critical current degradation in such a large compressive strain regime.

As can be appreciated from the foregoing, this invention provides an improved method and apparatus utilizing superconducting elements having extended strain operating range capabilities with no appreciable degradation of critical current.

What is claimed is:

1. In an apparatus for utilizing electrical energy, a superconducting element having intrinsic elastic strains of magnitude greater than 0.4% imposed thereon, said superconducting element being formed from a crystalline compound superconductive material that is capable of withstanding said intrinsic elastic strains imposed on said superconductive material in said element without appreciably degrading the critical current of said element when said superconducting element is subjected to a magnetic field having its component normal to the current carrying direction of said element greater than 8 Tesla.

2. The superconducting element of claim 1 wherein said crystalline compound superconductive material is selected from the B1 crystal structure class.

3. The superconducting element of claim 1 wherein said crystalline compound superconductive material is selected from one of NbN, recrystallized NbN, and NbCN.

4. The superconducting element of claim 1 wherein said crystalline compound superconductive material is selected from the C15 crystal structure class.

5. The superconducting element of claim 4 wherein said crystalline compound superconductive material is $V_2(Hf,Zr)$.

6. The superconducting element of claim 1 wherein said critical current of said element is greater than about 95% of the strain-free critical current of said element under the same magnetic field conditions.

7. The superconducting element of claim 6 wherein said crystalline compound superconductive material is selected from the B1 crystal structure class.

8. The superconducting element of claim 7 wherein said crystalline compound superconductive material is selected from one of NbN, recrystallized NbN and NbCN.

9. The superconducting element of claim 6 wherein said crystalline compound superconductive material is selected from the C15 crystal structure class.

10. The superconducting element of claim 9 wherein said crystalline compound superconductive material is $V_2$ (Hf, Zr).

11. The superconducting element of claim 6 wherein said intrinsic elastic strains are greater than 0.3% in magnitude with said magnetic field component greater than 12 Tesla.

12. The superconducting element of claim 1 wherein said critical current of said element is greater than about 98% of the strain-free critical current of said element under the same magnetic field condition where said intrinsic elastic strains are greater than 0.3% in magnitude with said magnetic field component greater than 10 Tesla.

13. Electromagnetic apparatus, comprising:
   mounting means;
   a superconducting element mounted on said mounting means, said superconducting element having intrinsic elastic strains of magnitude greater than 0.4% imposed thereon, said strains being imposed at least in part by said mounting means, and said superconducting element being formed from a crystalline compound superconductive material that is capable of withstanding said intrinsic elastic strains imposed on said superconductive material in said element without appreciably degrading the critical current of said element when said superconducting element is subjected to a magnetic field having its component normal to the current carrying direction of said element greater than 8 Tesla; and
   means adapted to provide high current to said superconducting element.

14. The electromagnetic apparatus of claim 13 wherein said superconducting element is conductor wound into a magnet configuration, and wherein said mounting means positions said conductor for utilization purposes.

15. The electromagnetic apparatus of claim 13 wherein said superconductive material is a crystalline compound material selected from one of the B1 and C15 crystal structure classes.

16. The electromagnetic apparatus of claim 15 wherein said superconductive material is selected from one of NbN, recrystallized NbN, NbCN, and $V_2$(Hf, Zr).

17. A method for maintaining critical current in a superconductive element subjected to intrinsic elastic strains, said method comprising:

selecting a superconducting element formed from a crystalline compound superconductive material that is capable of withstanding intrinsic elastic strains imposed on said superconductive material in said element without appreciably degrading the critical current of said element when said superconducting element is subjected to a magnetic field having its component normal to the current carrying the direction of said element greater than 8 Tesla; and forming said selected superconductor element into a magnetic configuration such that the intrinsic elastic strains on said superconducting element are of a magnitude greater than 0.4%.

18. The method of claim 17 wherein said method includes selecting a crystalline compound superconductive material from one of the B1 and C15 crystal structure classes.

19. The method of claim 18 wherein said method includes selecting a superconductive material from one of NbN, recrystallized NbN, NbCN, and $V_2$(Hf, Zr).

20. The method of claim 17 wherein said method includes selecting a crystalline compound superconductive material wherein the critical current of said element is greater than about 95% of the strain-free critical current of the element under the same magnetic field conditions.

* * * * *